United States Patent [19]
Saito

[11] Patent Number: 5,936,839
[45] Date of Patent: Aug. 10, 1999

[54] HEAT RADIATING STRUCTURE OF ELECTRONIC DEVICE

[75] Inventor: Tatsuo Saito, Fukushima-ken, Japan

[73] Assignee: Alps Electric Company, Ltd., Tokyo, Japan

[21] Appl. No.: 09/135,314

[22] Filed: May 12, 1998

[30] Foreign Application Priority Data

May 12, 1997 [JP] Japan ..................................... 9-121042

[51] Int. Cl.⁶ .................................................. H05K 7/20
[52] U.S. Cl. ........................ 361/707; 174/16.3; 361/690; 361/710; 361/715
[58] Field of Search .................................. 165/80.2, 80.3, 165/185; 174/16.3, 35 R, 35 GC; 257/706, 707, 712, 718–719, 726–727; 361/690, 704, 707, 709–711, 715, 719–720, 737, 816, 818

[56] References Cited

U.S. PATENT DOCUMENTS

| | | | |
|---|---|---|---|
| 4,471,407 | 9/1984 | Sleder | 361/709 |
| 5,327,324 | 7/1994 | Roth | 361/707 |
| 5,461,541 | 10/1995 | Wentland, Jr. et al. | 361/707 |
| 5,526,232 | 6/1996 | Kolberg et al. | 361/715 |

FOREIGN PATENT DOCUMENTS 09102685  4/1997  Japan .

*Primary Examiner*—Gregory D. Thompson
*Attorney, Agent, or Firm*—Brinks Hofer Gilson & Lione

[57] ABSTRACT

The heat radiating structure of an electronic device according to the present invention comprises upper and lower shielding cases, a printed circuit board disposed between the upper and lower shielding cases, and a heat radiating member mounted to the board to absorb and radiate heat which is generated from a heat generating component. Heat conduction members formed of an insulating material are disposed respectively on upper and lower end sides of the heat radiating member so as to be abutted against the upper and lower shielding cases.

3 Claims, 2 Drawing Sheets

HEAT RADIATING STRUCTURE OF ELECTRONIC DEVICE

BACKGROUND OF THE INVENTION

1. Field of the Invention

The present invention relates to a heat radiating structure of an electronic device capable of efficiently radiating the heat generated from a heat generating component such as a power source of the electronic device to the exterior of the device and thereby preventing the rise in temperature of the device.

2. Description of the Prior Art

Description is now directed to a conventional heat radiating structure of an electronic device including a heat generating component such as a power source, with reference to FIG. 5 which is a sectional view showing a principal portion of the heat radiating structure. Between an upper metallic shielding case 1 and a lower metallic shielding case 2 is disposed a printed circuit board 3. Electric components such as capacitors or coils are fixed onto the printed circuit board 3 by soldering.

A large number of heat radiating holes 1a are formed in the upper shielding case 1.

A heat sink 7 having a power transistor 5 attached thereto with bolt 6 or the like is fixed onto the printed circuit board 3. A predetermined gap is formed between the upper portion of the heat sink 7 and the upper shielding case 1.

The interior of the electronic device is covered with a shielding case (not shown) disposed around the device.

The interior of the electronic device is partitioned by the printed circuit board 3 into an upper compartment 8 and a lower compartment 9.

According to such a conventional heat radiating structure of the electronic device, when the power transistor 5 attached to the heat sink 7 generates heat while the electronic device is in use, the heat sink 7 absorbs the generated heat and this absorbed heat is radiated to the upper compartment 8 in the electronic device.

When the air present in the upper compartment 8 is heated by the above heat radiation and becomes high in temperature, there occurs a natural convection between this high-temperature air and the outside cold air. As a result of this convection, the high-temperature air present in the interior is discharged to the exterior through the heat radiating holes 1a to prevent an increase in the internal temperature of the electronic device.

In the above conventional heat radiating structure of the electronic device, however, by only such a natural convection as mentioned above, it is difficult for the high-temperature air to be discharged satisfactorily to the exterior through the heat radiating holes 1a, resulting in that the temperature of the air present in the upper compartment 8 becomes high. Consequently, the heat sink 7 also becomes high in temperature to such an extent that it can no longer absorb the heat generated from the power transistor 5, thus giving rise to the problem that the performance of the power transistor is deteriorated.

As the temperature of the upper compartment 8 becomes high, the electric components 4 mounted on the printed circuit board 3 are deteriorated in performance or broken, resulting in deteriorated performance of the entire electronic device.

Moreover, since a large number of heat radiating holes 1a are formed in the upper shielding case 1, the strength of the upper shielding case 1 becomes deteriorated and the gap between the upper shielding case 1 and the power transistor 5 is varied, for example, by vibration of the electronic device, thus giving rise to the problem that it is no longer possible to meet safety standards, etc. In the worst case, the upper shielding case 1 and the heat sink 7 come into contact with each other, leading to generation of noise for example.

There also has been the problem that dust or the like gets into the electronic device through the heat radiation holes 1a formed in the upper shielding case 1.

SUMMARY OF THE INVENTION

In order to solve the above-mentioned problems, according to the present invention, in the first aspect thereof, there is provided a heat radiating structure of an electronic device, comprising upper and lower shielding cases, a printed circuit board disposed between the upper and the lower shielding case, and a heat radiating member mounted to the printed circuit board to absorb and radiate the heat generated from a heat generating component, in which a heat conduction member formed of an insulating material is disposed on at least one of the upper and lower end sides of the heat radiating member in such a manner that it is in abutment with at least one of the upper and lower shielding cases.

In the second aspect of the present invention there is provided, in combination with the heat radiating structure in the first aspect, a heat radiating structure in which the heat conduction member is disposed on each of the upper and lower end sides of the heat radiating member in such a manner that the heat conduction member disposed on the upper end side of the heat radiating member and the heat conduction member disposed on the lower end side of the heat radiating member are respectively in abutment with the upper and lower shielding cases.

In the third aspect of the present invention there is provided, in combination with the heat radiating structure in the first aspect, a heat radiating structure in which the heat conduction member is formed of an insulating material having elasticity.

In the fourth aspect of the present invention there is provided, in combination with the heat radiating structure in the first aspect, a heat radiating structure in which the heat conduction member is a generally turned square U-shape and is attached to the heat radiating member.

DETAILED DESCRIPTION OF A PREFERRED EMBODIMENT

Figure 1:
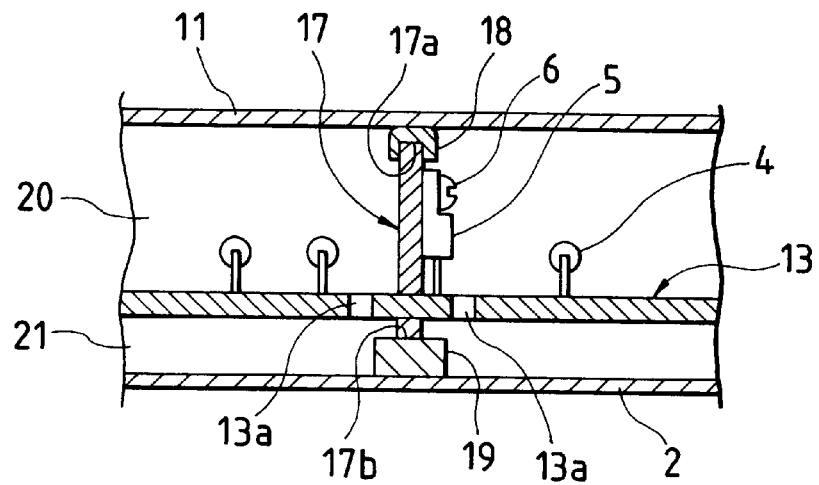
FIG. 1 is a sectional view showing a principal portion of a heat radiating structure of an electronic device embodying the present invention.

With reference to FIGS. 1 to 4, a description will be given below of a heat radiating structure according to an embodiment of the present invention in an electronic device which carries thereon a heat generating component such as a power source. As to the same members as those described above in connection with the prior art, they will be identified by the same reference numerals.

In the heat radiating structure of the electronic device embodying the invention, as shown in FIG. 1 which is a sectional view of a principal portion of the device, an upper metallic shielding case 11 and a lower metallic shielding case 2 are disposed in a predetermined spacing. Between and in parallel with the upper shielding case 11 and the lower shielding case 2 is disposed a printed circuit board 13 formed of a phenolic resin for example.

A plurality of electric components 4 such as capacitors or coils are fixed onto the printed circuit board 13 by soldering for example.

Further, a heat radiating member 17 having a heat generating component 5 such as a power transistor attached thereto with bolt 6 or the like is mounted on the printed circuit board 13.

The heat radiating member 17 is formed using a material which is of low cost and high in thermal conductivity, e.g. aluminum. In order to increase the surface area for efficient radiation of heat absorbed from the heat generating component 5, the heat radiating member 17 is formed in a large turned square U-shape having one open side.

Heat conduction members 18 and 19 having a high thermal conductivity are disposed on an upper end side 17a and a lower end side 17b, respectively, of the heat radiating member 17.

Figure 3:
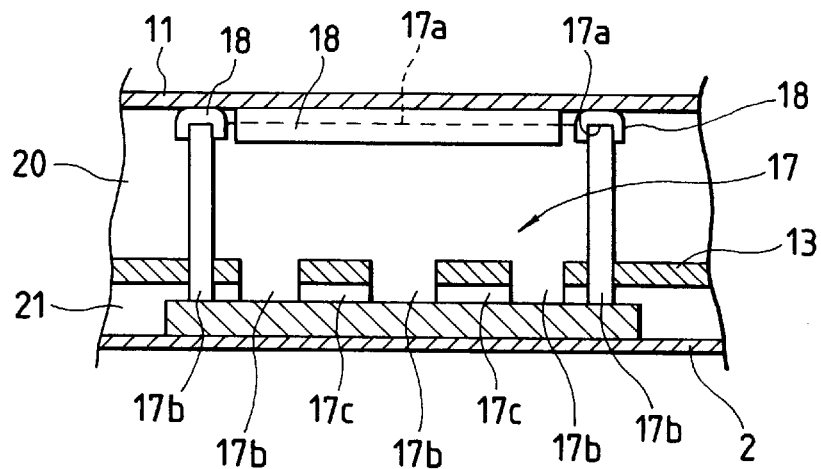
FIG. 3 is a sectional view showing a principal portion of the heat radiating structure.

As shown in FIG. 3, the lower end side 17b of the heat radiating member 17 is formed with a plurality of cut-out portions 17c, in which is fitted the printed circuit board 13. The lower end side 17b projects downward from the printed circuit board.

In the printed circuit board 13 are formed a plurality of heat radiating holes 13a in the vicinity of the heat radiating member 17.

The interior of the electronic device sandwiched between the upper shielding case 11 and the lower shielding case 2 is partitioned into an upper compartment 20 and a lower compartment 21 by means of the printed circuit board 13.

Figure 4:
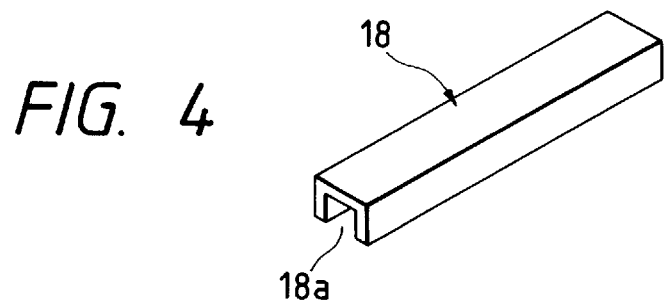
FIG. 4 is a perspective view of a heat conduction member used in the heat radiating structure.
Figure 5:
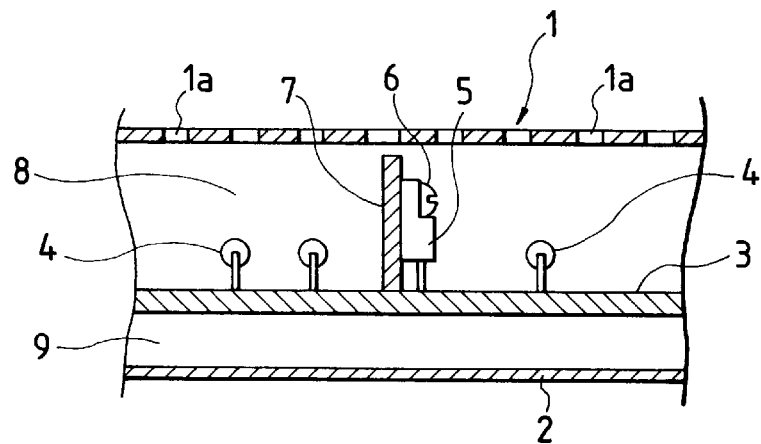
FIG. 5 is a sectional view showing a principal portion of a conventional heat radiating structure of an electronic device.

The heat conduction members 18 and 19 are formed using an insulating material high in thermal conductivity and having elasticity such as silicone rubber for example. As shown in FIG. 4, the heat conduction member 18 mounted on the upper end side 17a of the heat radiating member 17 has a generally turned square U-shaped external form, one side of which is open, with a groove 18a formed therein. By fitting the groove 18a on the upper end side 17a of the heat radiating member 17, the heat conduction member 18 can be mounted and temporarily fixed to the heat radiating member 17.

Figure 2:
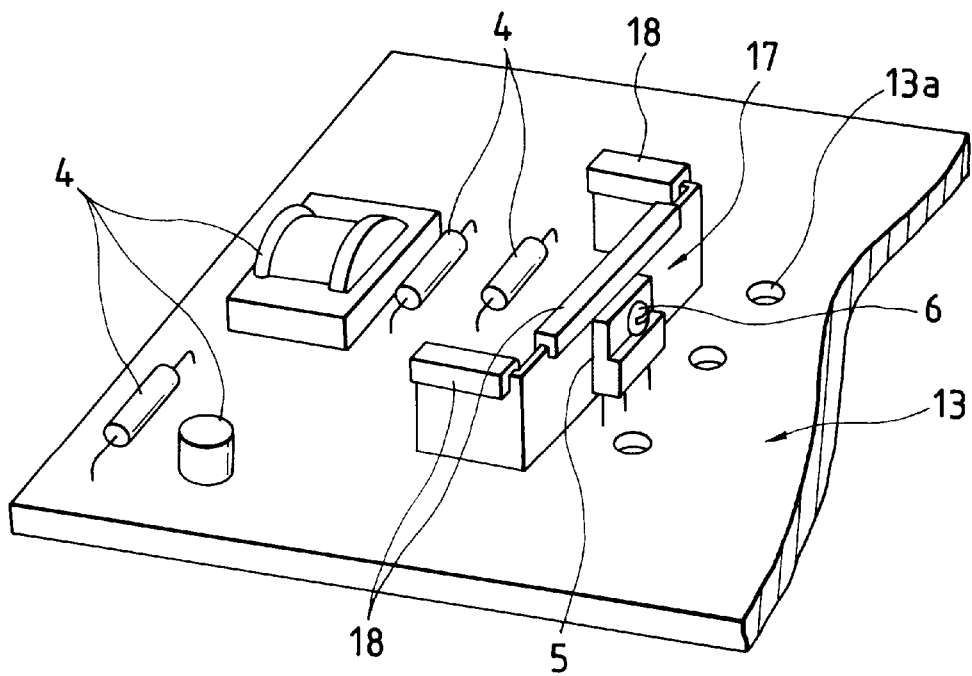
FIG. 2 is a perspective view showing a principal portion of the heat radiating structure.

The heat conduction member 18 is cut into pieces, which are mounted on the upper end side 17a of the heat radiating member 17 formed in a large turned square U-shape, as shown in FIG. 2.

The heat conduction member 19 disposed on the lower end side 17b of the heat radiating member 17 is grippingly held and mounted by both lower end 17b and lower shielding case 2. If necessary, the heat conduction member 19 may be fixed to the lower end side 17b or the lower shielding case 2 by bonding with use of an adhesive such as a double-coated tape for example.

The upper shielding case 11 is in abutment with the heat conduction member 18 mounted on the upper end side 17a of the heat radiating member 17, while the lower shielding case 2 is in abutment with the heat conduction member 19 mounted on the lower end side 17b of the heat radiating member.

Therefore, the heat of the heat radiating member 17 which becomes hot as a result of absorbing the heat of the heat generating component 5 can be directly conducted to the upper and lower shielding cases 11 and 2 through the heat conduction members 18 and 19 and thereby can be released to the exterior.

Also around the electronic device is disposed a shielding case to cover the interior of the device.

According to the heat radiating structure of the electronic device constructed as above, when the heat generating component 15 generates heat while the electronic device is in use, the heat radiating member 17 absorbs the heat, and this absorbed heat passes through the heat conduction member 18 mounted on the upper end side 17a of the heat radiating member and is conducted directly to the upper shielding case 11 of a wide surface area which is in abutment with the heat conduction member 18, whereby the heat can be radiated properly to the exterior.

Also as to the lower end side 17b of the heat radiating member 17, since the heat conduction member 19 disposed between the lower end side 17b and the lower shielding case 2 is in abutment with the lower end side in question, the heat of the heat radiating member 17 is directly conducted to the lower shielding case 2 of a wide surface area through the heat conduction member 19 and thus can be released properly to the exterior.

Moreover, since a plurality of heat radiating holes 13a are formed in the printed circuit board 13 at positions near the heat radiating member 17, even if the air present in the upper compartment 20 is heated by the heat radiated from the heat radiating member 17, the heated air passes through the heat radiating holes 13a and causes convection with the air which is not heated and present in the lower compartment 21. Thus, the rise in temperature of the electronic device can be suppressed more effectively.

Although in the above embodiment the heat conduction members 18 and 19 are disposed on both upper and lower end sides 17a, 17b of the heat radiating member 17, a modification may be made such that the heat conduction member 18 or 19 is disposed on one of the upper and lower end sides 17a, 17b of the heat radiating member so as to be abutted against either the upper shielding case 11 or the lower shielding case 2.

Although in the above embodiment such heat radiating holes as referred to above in connection with the prior art are not formed in the upper shielding case 11, heat radiating holes may be formed in the upper shielding case if necessary.

The heat radiating structure of the electronic device according to the present invention, as set forth hereinabove, comprises upper and lower shielding cases, a printed circuit board disposed between the upper and lower shielding cases, and a heat radiating member mounted to the printed circuit board to absorb and radiate the heat generated from a heat generating component, and in which a heat conduction member formed of an insulating material is disposed on at least one of the upper and lower end sides of the heat radiating member in such a manner that it is in abutment with at least one of the upper and lower shielding cases. Therefore, the heat from the heat generating component incorporated in the electronic device is conducted to the shielding case(s) and can thereby be released properly to the exterior. Consequently, the internal temperature of the electronic device can be controlled appropriately, that is, the interior heat generating element and electric components are not thermally affected, thus ensuring high performance of the electronic device.

Moreover, in the case where heat conduction members are disposed on both upper and lower end sides of the heat radiating member so as to be respectively abutted against the upper and lower shielding cases, the heat of the heat radiating member which has absorbed the heat from the heat generating component can be directly released to the exterior of the electronic device from the upper and lower shielding cases through the heat conduction members.

Consequently, it is possible to control the internal temperature of the electronic device appropriately so that the electric components, etc. mounted in the interior of the electronic device are not thermally affected, thereby ensuring high performance of the electronic device.

Further, since the heat radiating structure of the present invention is superior in heat radiating efficiency, such a large number of heat radiating holes as in the prior art need not be formed in the upper shielding case.

Consequently, it is possible to enhance the strength of the upper shielding case and also possible to prevent the entry of dust or the like into the electronic device.

Further, the heat conduction members are formed of a rubber material having elasticity, so once the upper and lower shielding cases are brought into abutment with the heat conduction members, the heat conduction members are deformed elastically to prevent the heat conduction members and the shielding cases from moving away from each other. That is, the shielding cases are always in contact with the heat conduction members. The heat of the heat radiating member which has absorbed the heat from the heat generating component can surely be released to the exterior of the electronic device.

Further, since the heat conduction members are formed of a rubber material, and it can be cut into pieces of a required length easily with scissors or the like if the material is long, thereby the material is easy to handle.

Additionally, since the heat conduction members are formed in a generally turned square U-shape, they can be attached to end portions of the heat radiating member easily by manual operation for example. Thus, the heat radiating structure is superior in assembling performance.

What is claimed is:

1. A heat radiating structure of an electronic device, comprising:

two upper and lower shielding cases;

a printed circuit board disposed between said two shielding cases;

a heat radiating member mounted to said printed circuit board to absorb and radiate heat which is generated from a heat generating component; and a heat conduction member formed of an insulating material and disposed on at least one of upper and lower sides of said heat radiating member, said heat conduction member being in abutment with one of said two shielding cases.

2. A heat radiating structure of an electronic device according to claim 1, wherein said heat conduction member is formed of a rubber material having elasticity.

3. A heat radiating structure of an electronic device according to claim 1, wherein said heat conduction member is formed of a rubber material having elasticity and having a groove formed therein, with said heat radiating member being fitted in said groove.

* * * * *